US012677685B2

(12) United States Patent
Chien et al.

(10) Patent No.: US 12,677,685 B2
(45) Date of Patent: Jul. 7, 2026

(54) PACKAGE STRUCTURE AND METHOD FOR FORMING THE SAME

(71) Applicant: TAIWAN SEMICONDUCTOR MANUFACTURING COMPANY LTD., Hsinchu (TW)

(72) Inventors: Chin-Her Chien, Taoyuan County (TW); Po-Hsiang Huang, Tainan City (TW); Cheng-Hung Yeh, Miaoli County (TW); Tai-Yu Wang, Hsinchu (TW); Ming-Ke Tsai, Hsinchu (TW); Yao-Hsien Tsai, Hsinchu County (TW); Kai-Yun Lin, Hsinchu City (TW); Chin-Yuan Huang, Hsinchu City (TW); Kai-Ming Liu, Hsinchu City (TW); Fong-Yuan Chang, Hsinchu County (TW); Chin-Chou Liu, Hsinchu County (TW); Yi-Kan Cheng, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 589 days.

(21) Appl. No.: 17/728,697

(22) Filed: Apr. 25, 2022

(65) Prior Publication Data

US 2022/0246509 A1 Aug. 4, 2022

Related U.S. Application Data

(62) Division of application No. 16/442,955, filed on Jun. 17, 2019, now Pat. No. 11,387,177.

(51) Int. Cl.
*H10W 70/685* (2026.01)
*H10W 70/05* (2026.01)
(Continued)

(52) U.S. Cl.
CPC ......... *H10W 70/685* (2026.01); *H10W 70/05* (2026.01); *H10W 70/095* (2026.01);
(Continued)

(58) Field of Classification Search
CPC .............. H01L 21/486; H01L 23/3114; H01L 21/02104; H01L 21/4857; H01L 21/565;
(Continued)

(56) References Cited

U.S. PATENT DOCUMENTS

2005/0001329 A1* 1/2005 Matsuki .............. H10W 72/012
257/777
2010/0155920 A1* 6/2010 Lee ................... H01L 23/49811
257/737

(Continued)

*Primary Examiner* — Julio J Maldonado
*Assistant Examiner* — Paul A Berry
(74) *Attorney, Agent, or Firm* — WPAT LAW; Anthony King

(57) ABSTRACT

A package structure and a method for forming the same are provided. The package structure includes a die, a first molding surrounding the die, a first redistribution layer (RDL), an interposer disposed over the first RDL, a second molding surrounding the interposer, a first via, and a second RDL. The first RDL includes a first dielectric layer disposed over the die and the first molding, and a first interconnect structure surrounded by the first dielectric layer and electrically connected to the die. The interposer is electrically connected to the die through the first interconnect structure. The first via extends through and within the second molding and is adjacent to the interposer. The second RDL includes a second dielectric layer disposed over the interposer and the second molding, and a second interconnect structure surrounded by the second dielectric layer and electrically connected to the via and the interposer.

20 Claims, 19 Drawing Sheets

(51) Int. Cl.
    *H10W 70/60*     (2026.01)
    *H10W 74/01*     (2026.01)
    *H10W 74/10*     (2026.01)

(52) U.S. Cl.
    CPC ........ *H10W 70/611* (2026.01); *H10W 74/016* (2026.01); *H10W 74/129* (2026.01)

(58) Field of Classification Search
    CPC ..... H01L 2224/023; H01L 2224/02311; H01L 2224/02331; H01L 2224/94; H01L 2224/97; H01L 23/498; H01L 23/49822; H01L 23/49833; H01L 23/4994; H01L 23/5383; H01L 23/5385; H01L 23/5389; H01L 24/18; H01L 24/97; H01L 23/49894; H01L 2224/02372; H01L 2224/024; H01L 21/56; H01L 2225/06548; H01L 23/49811; H01L 23/5381; H01L 23/4821; H10W 72/0198; H10W 70/614; H10W 70/60; H10W 70/69; H10W 70/05; H10W 72/823; H10W 90/701; H10W 74/01; H10W 74/016
    See application file for complete search history.

(56) References Cited

U.S. PATENT DOCUMENTS

| 2013/0009307 | A1* | 1/2013 | Lu ....................... H10W 74/017 257/738 |
| 2016/0064309 | A1* | 3/2016 | Su ........................... H01L 25/50 257/773 |
| 2017/0062383 | A1* | 3/2017 | Yee ....................... H10W 90/00 |
| 2020/0126897 | A1* | 4/2020 | Kiso .................... H01L 23/295 |

\* cited by examiner

PACKAGE STRUCTURE AND METHOD FOR FORMING THE SAME

PRIORITY CLAIM AND CROSS-REFERENCE

This application is a divisional application of non-provisional application Ser. No. 16/442,955 filed on Jun. 17, 2019, entitled "PACKAGE STRUCTURE AND METHOD FOR FORMING THE SAME," the disclosure of which is hereby incorporated by reference in its entirety.

BACKGROUND

With the evolving of semiconductor technologies, semiconductor dies continue to be produced in smaller and smaller sizes. At the same time, more and more functionality is demanded from the semiconductor dies. Accordingly, the semiconductor dies need to have increasingly greater numbers of I/O pads packed into smaller areas, and the density of the I/O pads rises quickly with time. As a result, the packaging of the semiconductor dies becomes more difficult, which adversely affects the yield of the packaging.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
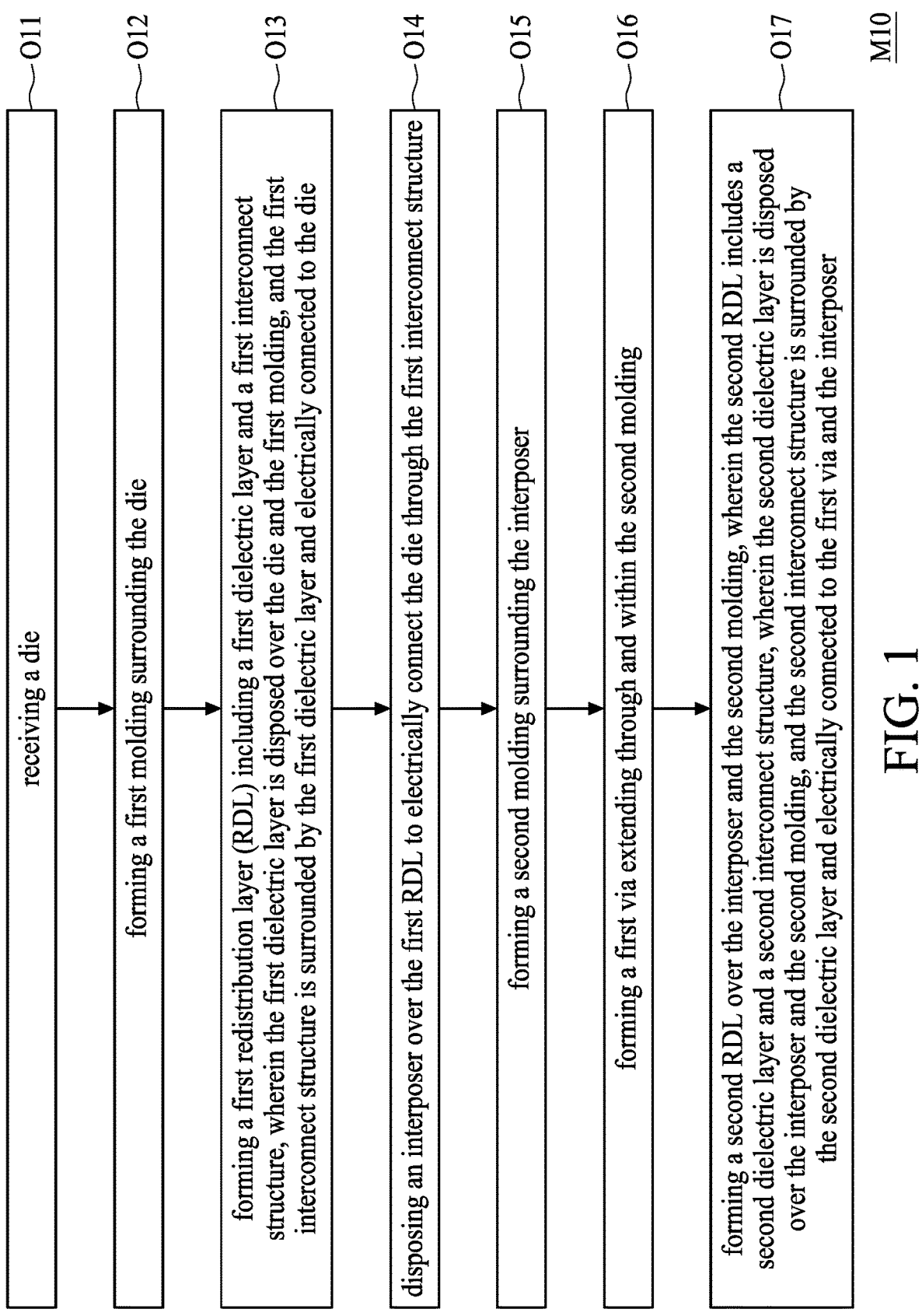
FIG. 1 is a flowchart showing various steps of a method for forming a package structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

As a key element of reduced scale of an electrical device, a semiconductor package structure needs to be as small as possible, while maintaining wire-routing density and density of input/output terminals. It is difficult to further reduce the scale or increase a routing density of the package structure. The present disclosure provides a package structure and a method for forming the same. The package structure of the present disclosure includes an interposer in a molding and adjacent to through-molding vias in the molding, wherein technologies and apparatuses used in formation of a die are also applied in formation of the interposer to enhance precision and density of the wire routing of the package structure. However, it is difficult to perform a comprehensive design rule check (DRC), resistance-capacitance check (RC check), resistance-inductance-and-capacitance check (RLC check), and/or static timing analysis (STA) on an integrated package structure due to different required techniques, different design languages and different design formats used in different stages of the manufacturing process. The present disclosure also provides a method of analyzing a package structure in accordance with the present disclosure.

FIG. 1 shows a flowchart of a method M10 for forming a package structure 10 in accordance with some embodiments of the present disclosure. The method M10 includes: (O11) receiving a die; (O12) forming a first molding surrounding the die; (O13) forming a first redistribution layer (RDL) including a first dielectric layer and a first interconnect structure, wherein the first dielectric layer is disposed over the die and the first molding, and the first interconnect structure is surrounded by the first dielectric layer and electrically connected to the die; (O14) disposing an interposer over the first RDL to electrically connect the die to the first interconnect structure; (O15) forming a second molding surrounding the interposer; (O16) forming a first via extending through and within the second molding; and (O17) forming a second RDL over the interposer and the second molding, wherein the second RDL includes a second dielectric layer and a second interconnect structure, wherein the second dielectric layer is disposed over the interposer and the second molding, and the second interconnect structure is surrounded by the second dielectric layer and electrically connected to the first via and the interposer.

In order to illustrate concepts and the method M10 of the present disclosure, various embodiments are provided below. However, it is not intended to limit the present disclosure to specific embodiments. In addition, elements, conditions or parameters illustrated in different embodiments can be combined or modified to form different combinations of embodiments as long as the elements, parameters or conditions used are not conflicted. For ease of illustration, reference numerals with similar or same functions and properties are repeatedly used in different embodiments and figures.

Figure 2:
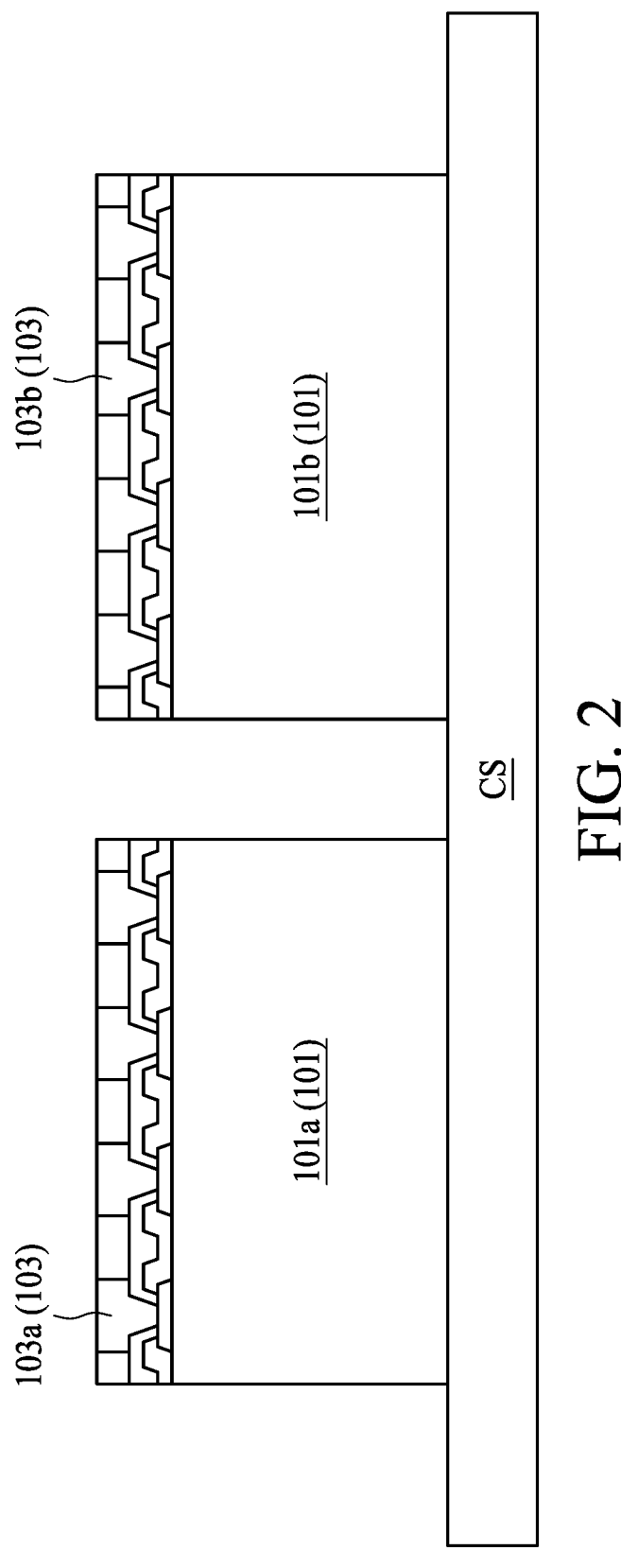
FIGS. 2 to 18 are cross-sectional diagrams of a package structure at various stages of manufacture by a method in accordance with some embodiments of the present disclosure.

FIG. 2 is a cross-sectional diagram illustrating the operation O11 of the method M10 in accordance with some embodiments of the present disclosure. A die 101 is received or provided. In some embodiments, a plurality of dies 101 is disposed over a carrier substrate CS. In some embodiments, the dies 101 are temporarily attached on the carrier substrate CS.

In some embodiments, the plurality of dies 101 include a first die 101a and a second die 101b adjacent to the first die, wherein the first die 101a and the second die 101b are attached to the carrier substrate CS for further processing. Each of the dies 101 includes a plurality of contacts 103 disposed over the die 101. Each of the contacts 103 is electrically connected to circuitry or electrical component disposed over or within the die 101. In some embodiments, the first die 101a includes a plurality of first contacts 103a, and the second die 101b includes a plurality of second contacts 103b. The contacts 103 are exposed in a direction away from the carrier substrate CS.

In some embodiments, a die design file of the dies 101 with a first format is received along with the dies 101. In some embodiments, the die design file does not include RLC data, and an RLC extraction is performed to generate an updated die design file including RLC data.

Figure 3:
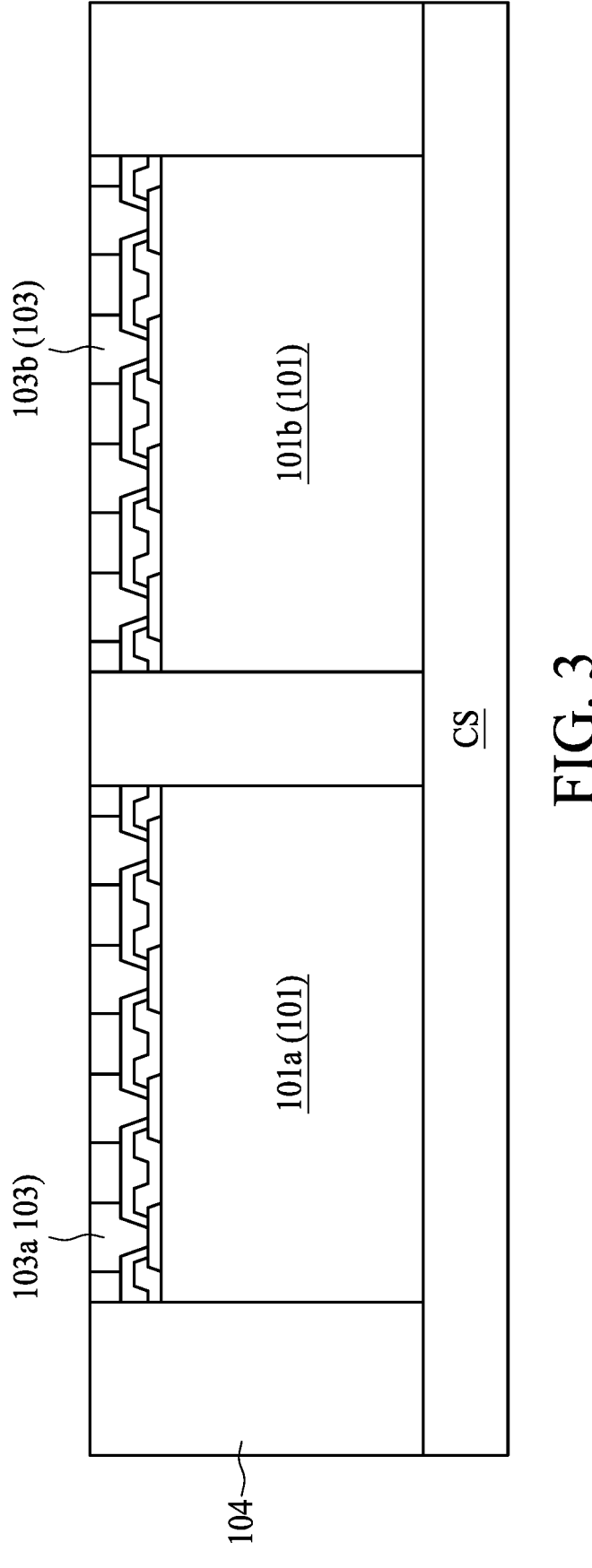

FIG. 3 is a cross-sectional diagram illustrating the operation O12 of the method M10 in accordance with some embodiments of the present disclosure. A first molding 104 is formed surrounding the dies 101. In some embodiments, the first die 101a and the second die 101b are separated by the first molding 104. In some embodiments, contacts 103 of the dies 101 are exposed through the first molding 104. In some embodiments, the first molding 104 is formed by disposing a molding material over the carrier substrate CS and encapsulating the dies 101. In some embodiments, the molding material includes molding compound, epoxy or any other suitable material. In some embodiments, the molding material is disposed by compression molding, transfer molding or any other suitable operations.

In some embodiments, a portion of the molding material is removed to expose the contacts 103 of the dies 101 to form the first molding 104. In some embodiments, a chemical mechanical polish (CMP) is performed to remove the portion of the molding material covering the dies 101. In some embodiments, the first contacts 103a and the second contacts 103b are substantially coplanar with a top surface of the first molding 104.

Figure 4:
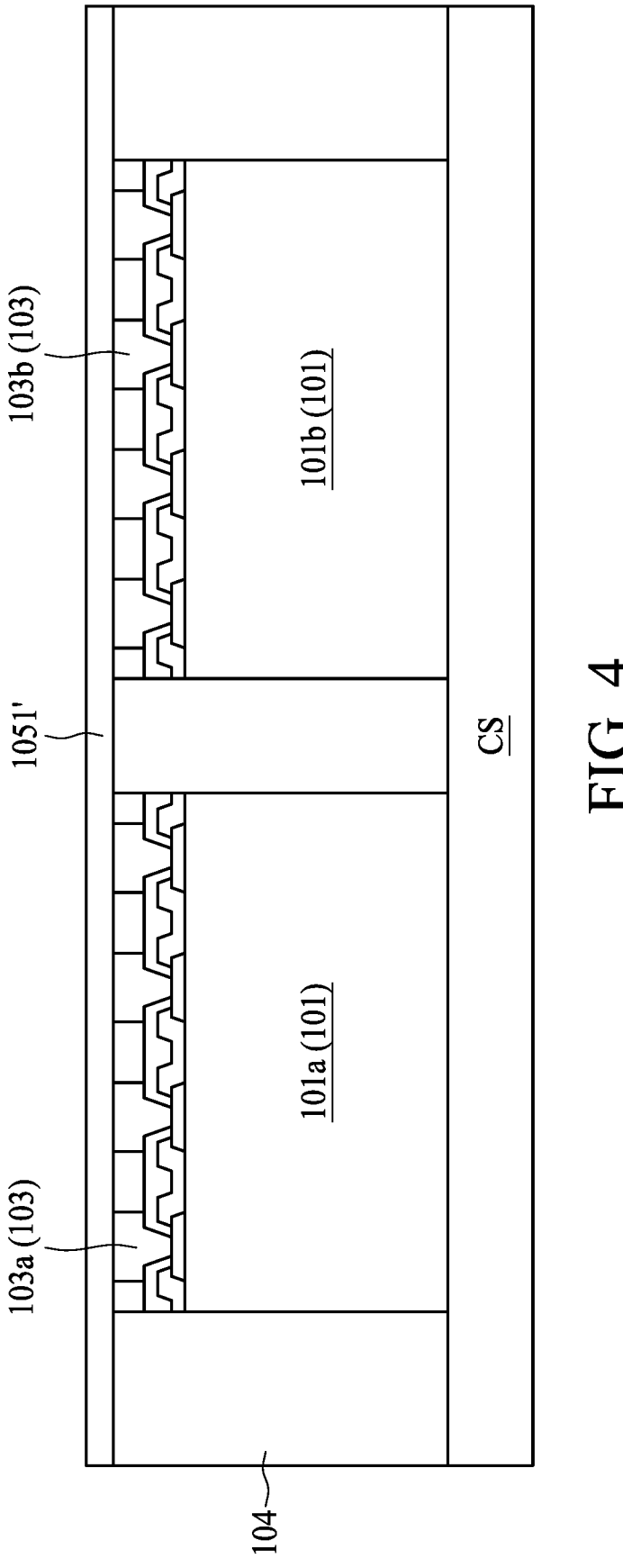
Figure 5:
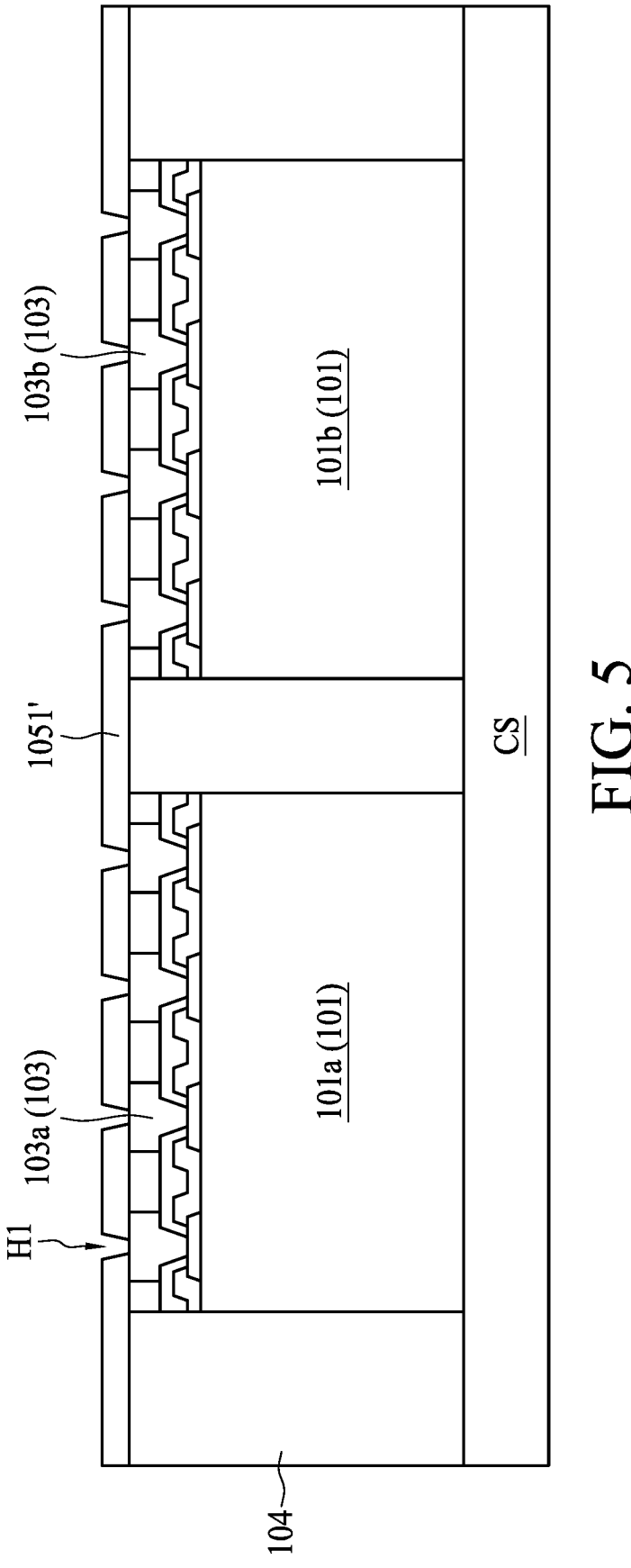
Figure 6:
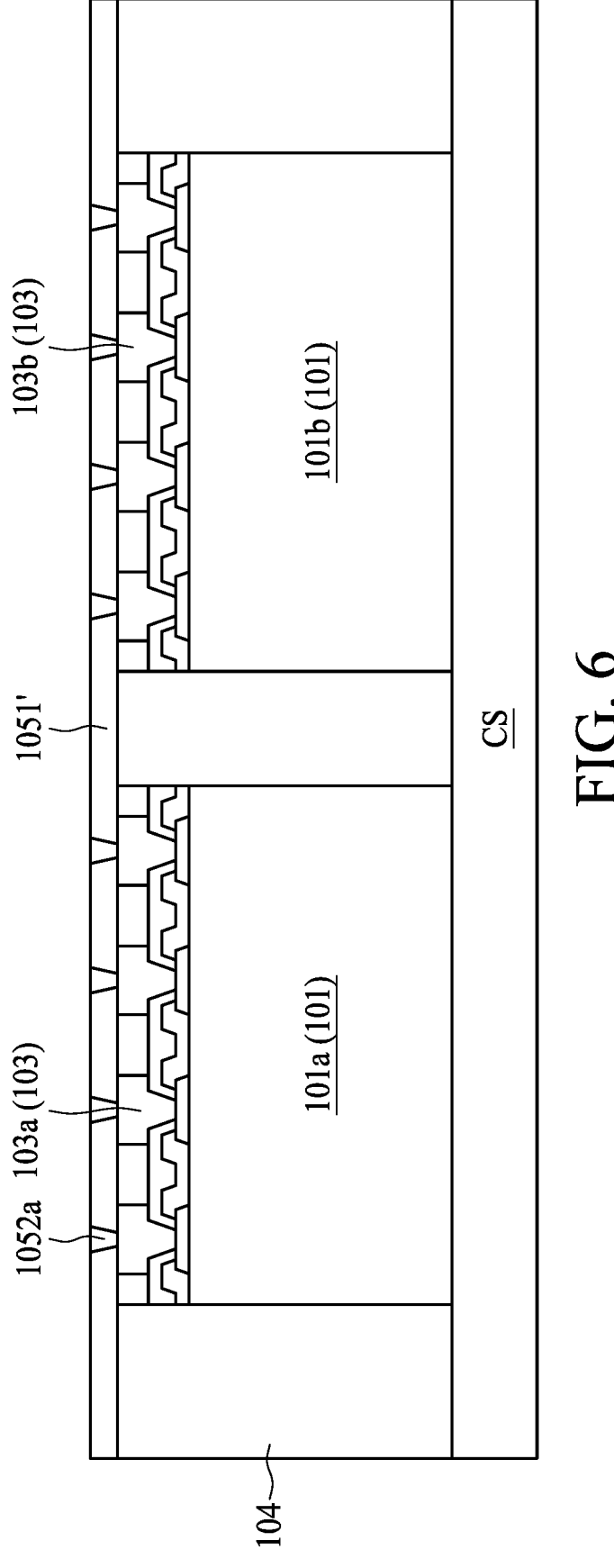

FIGS. 4 to 6 are cross-sectional diagrams illustrating the operation O13 of the method M10 in accordance with some embodiments of the present disclosure. A first redistribution layer (RDL) 105 is formed covering the dies 101 and the first molding 104. The first RDL 105 includes a first dielectric layer 1051 over the dies 101 and the first molding 104, and a first interconnect structure 1052 surrounded by the first dielectric layer 1051 and electrically connected to the dies 101. In some embodiments, the first interconnect structure 1052 contacts the contacts 103 of the dies 101 to electrically connect the first interconnect structure 1052 to the dies 101.

In some embodiments, the first RDL 105 is a multi-layer structure. In some embodiments, the first dielectric layer 1051 includes a plurality of layers of dielectric materials stacked in sequence over the dies 101 and the moldings 104. In some embodiments, the first interconnect structure 1052 includes a plurality of conductive patterns distributed in and surrounded by the plurality of layers of dielectric materials. In some embodiments, the conductive patterns include via portions and pad portions. In some embodiments, the via portion extends through at least one layer of dielectric materials, and the pad portion contacts with the via portion and extends over a layer of dielectric materials.

In some embodiments, the formation of the first RDL 105 includes several operations. A dielectric material 1051' is disposed over the die 101 and the molding 102 as shown in FIG. 4. In some embodiments, the dielectric material 1051' is a substantially planar layer. A portion of the dielectric material 1051' is removed by etching or any other suitable operations to form a plurality of openings H1 respectively over the contacts 103 of the dies 101 as shown in FIG. 5.

Figure 7:
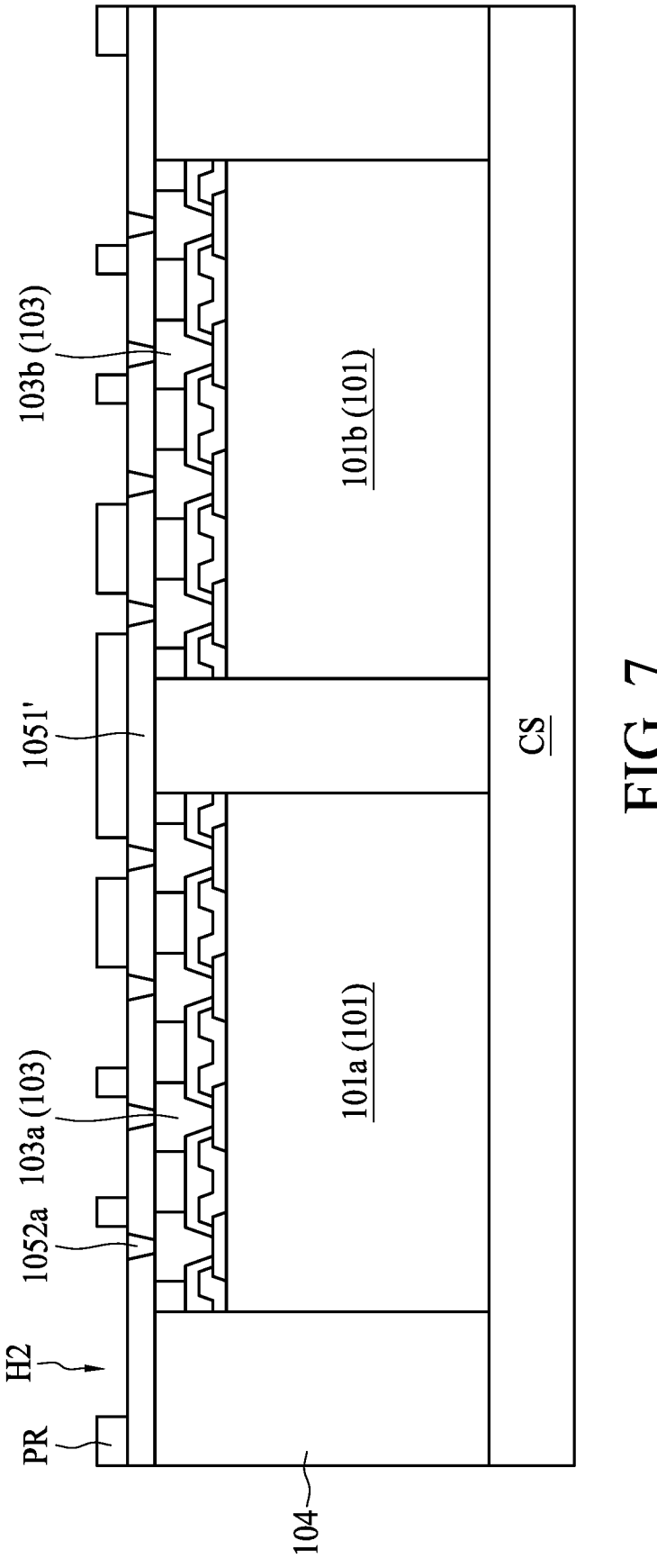
Figure 8:
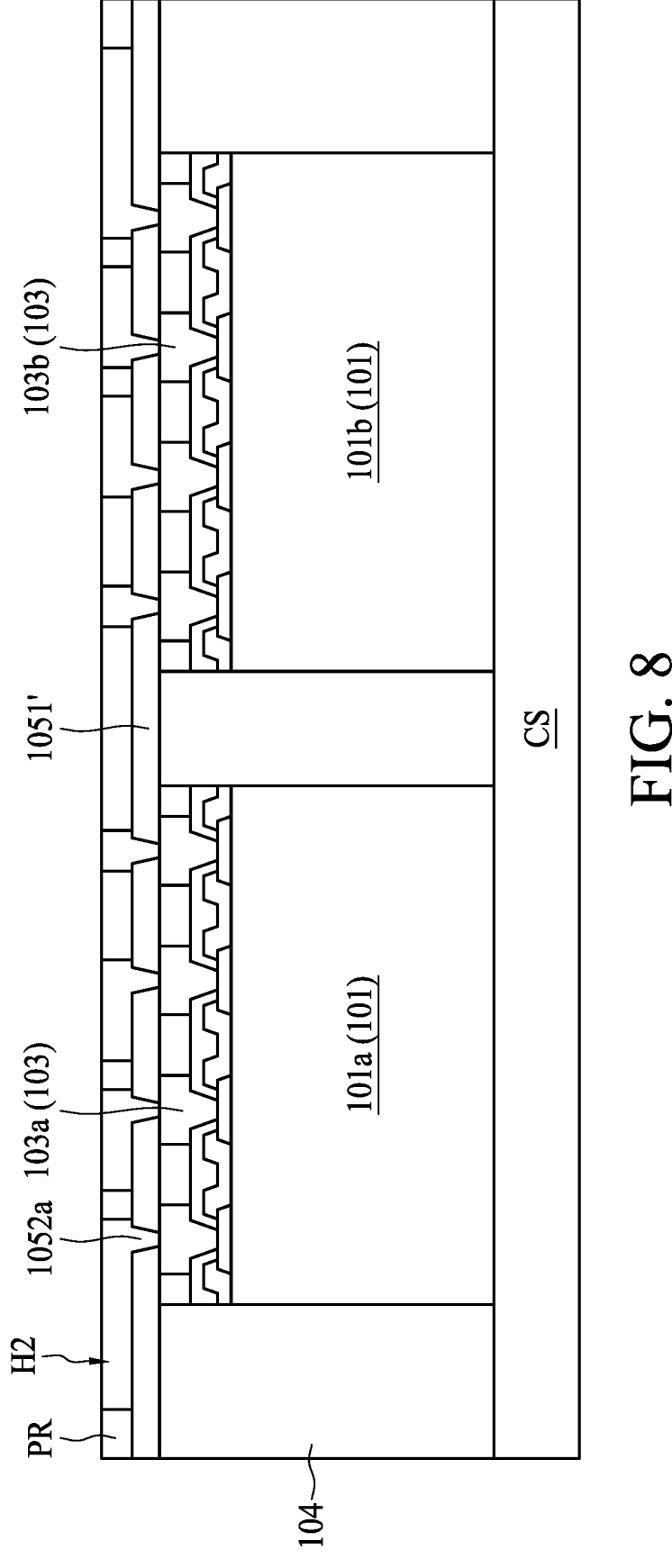

After the formation of the openings H1, a conductive material is disposed within the opening H1 to form a via portion 1052a of the first interconnect structure 1052, as shown in FIG. 6. In some embodiments, the via portion 1052a is in contact with the contacts 103 of the dies 101. A photoresist is disposed over the dielectric material 1051' and is patterned to form a patterned photoresist PR including an opening H2, as shown in FIG. 7. At least a portion of the via portion 1052a is exposed through the patterned photoresist PR by the opening H2. A conductive material is disposed within the opening H2 to form a pad portion 1052b of the first interconnect structure 1052 to electrically connect to the via portion 1052*a* as shown in FIG. 8. In some embodiments, the conductive material is disposed by electroplating, sputtering or any other suitable operations. In some embodiments, the pad portion 1052*b* is in contact with the via portion 1052*a*.

Figure 9:
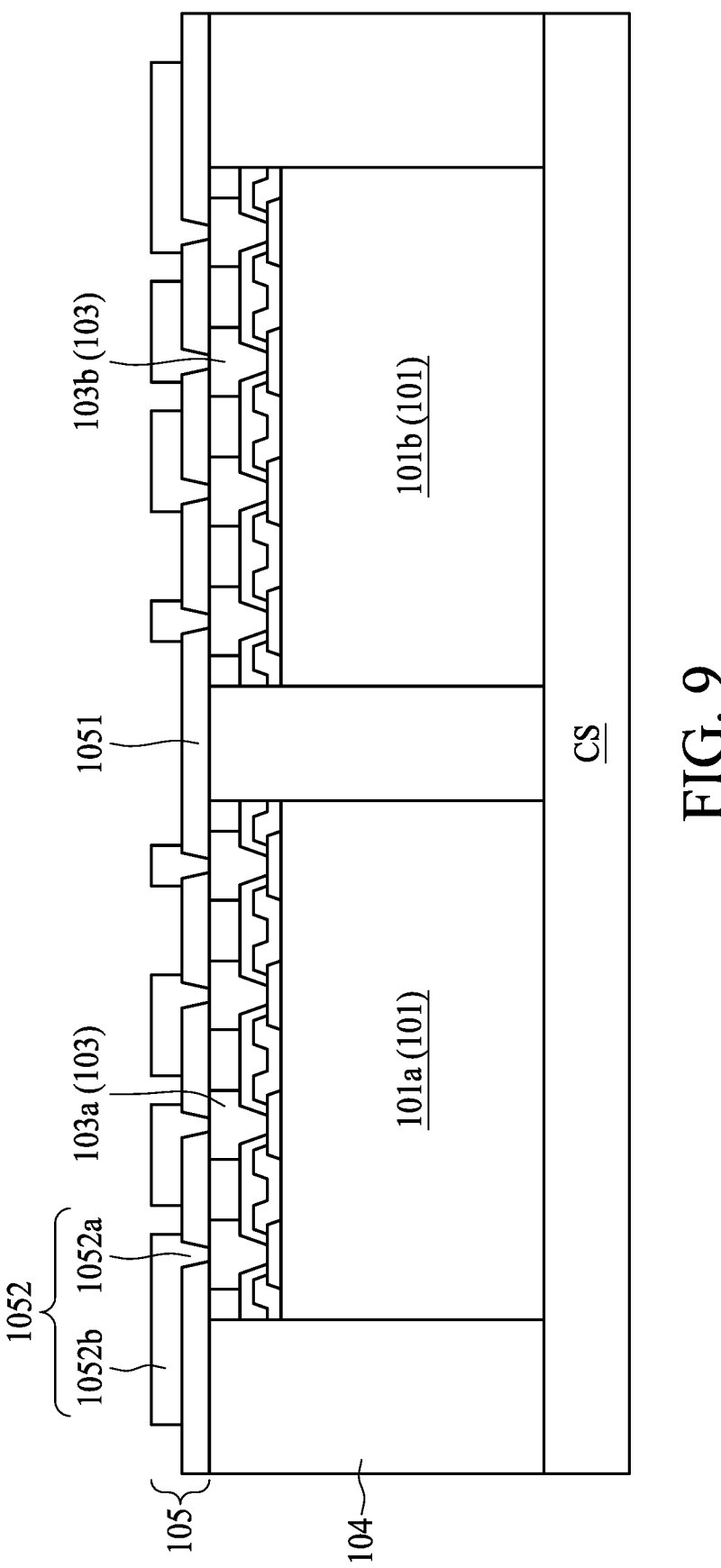

The patterned photoresist PR is then removed and the first RDL 105 is formed as shown in FIG. 9. In some embodiments, formation of the dielectric material 1051', the via portions 1052*a* and the pad portions 1052*b* is repeated to form the first RDL 105. In some embodiments, the first dielectric layer 1051 is formed from one or more layers of dielectric materials 1051'. In some embodiments, the first interconnect structure 1052 includes one or more of via portions 1052*a* and one or more of pad portions 1052*b* arranged at intervals. For example, one pad portion 1052*b* contacts more than one via portions 1052*a*. In some embodiments, more than one via portions 1052 are stacked and electrically connected to one pad portion 1052*b*. For a purpose of ease of illustration, only one pad portion 1052*b* disposed over one via portion 1052*a* is illustrated in the figures, but such illustration is not intended to limit the present disclosure.

In some embodiments, a first RDL design file of the first RDL 105, with a second format is received before formation of the first RDL 105. In some embodiments, the first RDL design file includes RLC data, and an RC extraction is performed to generate an updated first RDL design file including RC data. In some embodiments, the first format of the die design file and the second format of the first RDL design file are incompatible. In some embodiments, the updated die design file is input into a package design software to generate a new file including the locations and layout of the die contacts (e.g., the contacts 103), wherein a configuration of the die contacts can be seen in the layout of the new file. Therefore, the first RDL 105 can be designed to electrically connect to the dies 101. A design rule check (DRC) can be also be performed on the integrated first RDL 105 and the dies 101 to ensure that the layout of the package structure conforms to the design rules.

Figure 10:
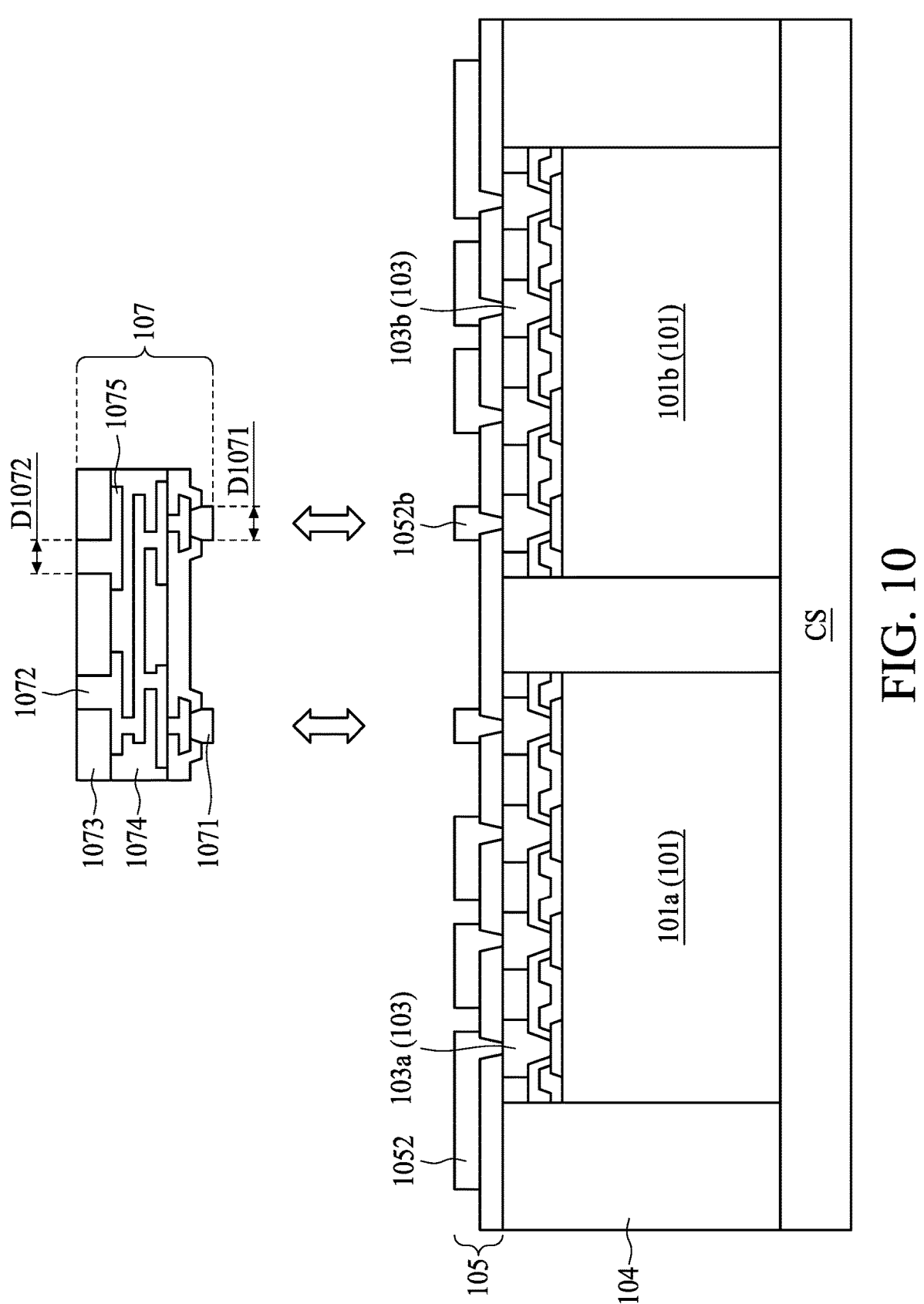

FIG. 10 is cross-sectional diagram illustrating the operation O14 of the method M10 in accordance with some embodiments of the present disclosure. An interposer 107 is disposed over the first RDL 105 to electrically connect at least one of the dies 101 through the first interconnect structure 1052 of the first RDL 105. In some embodiments, the interposer 107 is disposed over and electrically connected to the dies 101 (e.g., the first die 101*a* and the second die 101*b*), such that the first die 101*a* and the second die 101*b* are electrically connected to each other through the interposer 107.

In some embodiments, the interposer 107 includes a conductive pillar 1071 at a bottom of the interposer 107. In some embodiments, the conductive pillar 1071 is exposed in order to electrically connect to at least one of the dies 101. In some embodiments, a width D1071 of the conductive pillar 1071 is in a range of about 5 to about 50 microns.

In some embodiments, the interposer 107 includes one or more vias 1072 in a silicon layer 1073. In some embodiments, the via 1072 penetrates through and extends within the silicon layer 1073. In some embodiments, the via 1072 has a width D1072 in a range of about 5 to about 60 microns. In some embodiments, the via 1072 is referred to as a micro-via due to its micrometer-scale diameter. In some embodiments, the via 1072 is a through silicon via (TSV). In some embodiments, the width D1072 of the via 1072 is greater than the width D1071 of the conductive pillar 1071.

In some embodiments, the interposer 107 includes an inter-dielectric layer 1074, disposed proximal to the first RDL 105 and between the first RDL 105 and the silicon layer 1073. In some embodiments, the inter-dielectric layer 1074 is between the silicon layer 1073 and the conductive pillar 1071. In some embodiments, an interconnection structure 1075 is disposed in the inter-dielectric layer 1074 to electrically interconnect the first die 101*a* and the second die 101*b*. In some embodiments, the interconnection structure 1075 electrically interconnects the conductive pillars 1071 and the vias 1072.

In some embodiments, the interposer 107 is electrically connected to only one of the first die 101*a* and the second die 101*b*. In some embodiments, the interposer 107 is electrically connected to the first die 101*a* and the second die 101*b*. In some embodiments, in order to ensure electrical connections between the interposer 107 and the die(s) 101, centers of the conductive pillars 1071 are designed to align with centers of the pad portions 1052*b* of the first RDL 105, wherein the pad portions 1052*b* are electrically connected to the first die 101*a* and/or the second die 101*b*.

Figure 11:
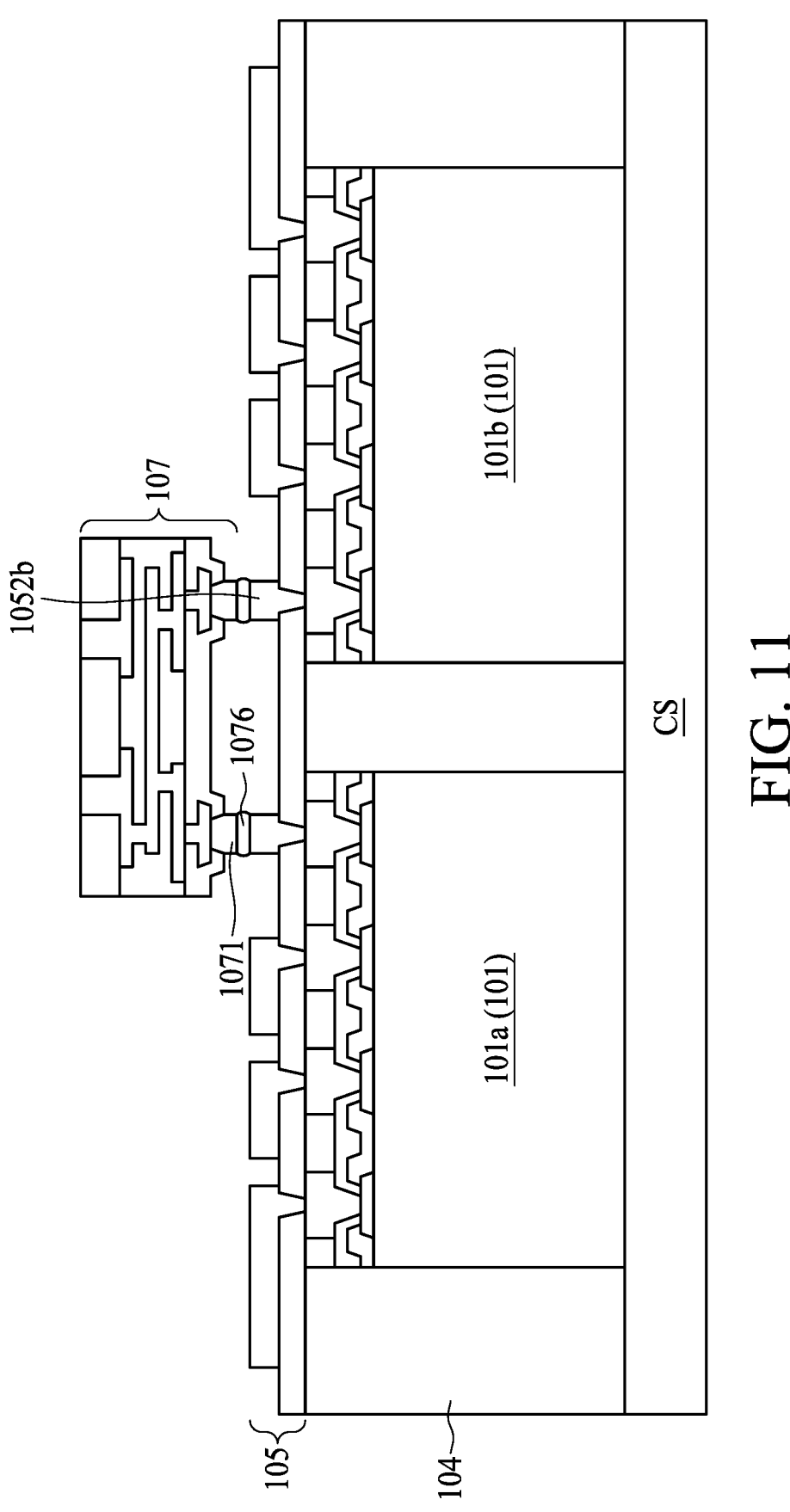

Referring to FIG. 11, in accordance with some embodiments, the method M10 further includes forming a plurality of solder members 1076 between the first RDL 105 and the interposer 107. More specifically, the solder members 1076 are formed to connect the pad portions 1052*b* of the first RDL 105 to the conductive pillars 1071 of the interposer 107. The interposer 107 is thereby electrically connected to the first RDL 105 by the solder members 1076. In some embodiments, the solder member 1076 is disposed over the conductive pillar 1071 by stencil pasting or any other suitable operations. In some embodiments, the conductive pillars 1071 are bonded with the pad portions 1052*b* by the solder members 1076. In some embodiments, the conductive pillar 1071 and the solder member 1076 are collectively referred to as a micro-bump of the interposer 107.

In some embodiments, a width of the pad portions 1052*b* connected to the interposer 107 is less than a width of the pad portions 1052*b* to be subsequently connected to through-vias 109 (described below) because the conductive pillar 1071 of the interposer 107 is much smaller than the through-vias 109 to be subsequently formed.

In some embodiments, a wire routing density of the interposer 107 is high, and the interposer 107 is formed using techniques and apparatuses used in formation of the dies 101. In some embodiments, an interposer design file, of the interposer 107, with a third format is received along with the interposer 107. In some embodiments, the interposer design file does not include RLC data, and an RLC extraction is performed to generate an updated interposer design file. In some embodiments, the first format of the die design file and the third format of the interposer design file are compatible. In some embodiments, the third format of the interposer design file and the second format of the first RDL design file are not compatible. In some embodiments, the updated interposer design file is input into a package design software to generate a new file including locations of the conductive pillars 1071. Therefore, the pad portions 1052*b* of the first RDL 105 can be designed to align with the conductive pillars 1071 to electrically connect the dies 101 to the interposer 107. DRC can be also performed on the integrated first RDL 105, the dies 101 and the interposer 107 to ensure the layout of a package structure conforms to the design rules.

Figure 12:
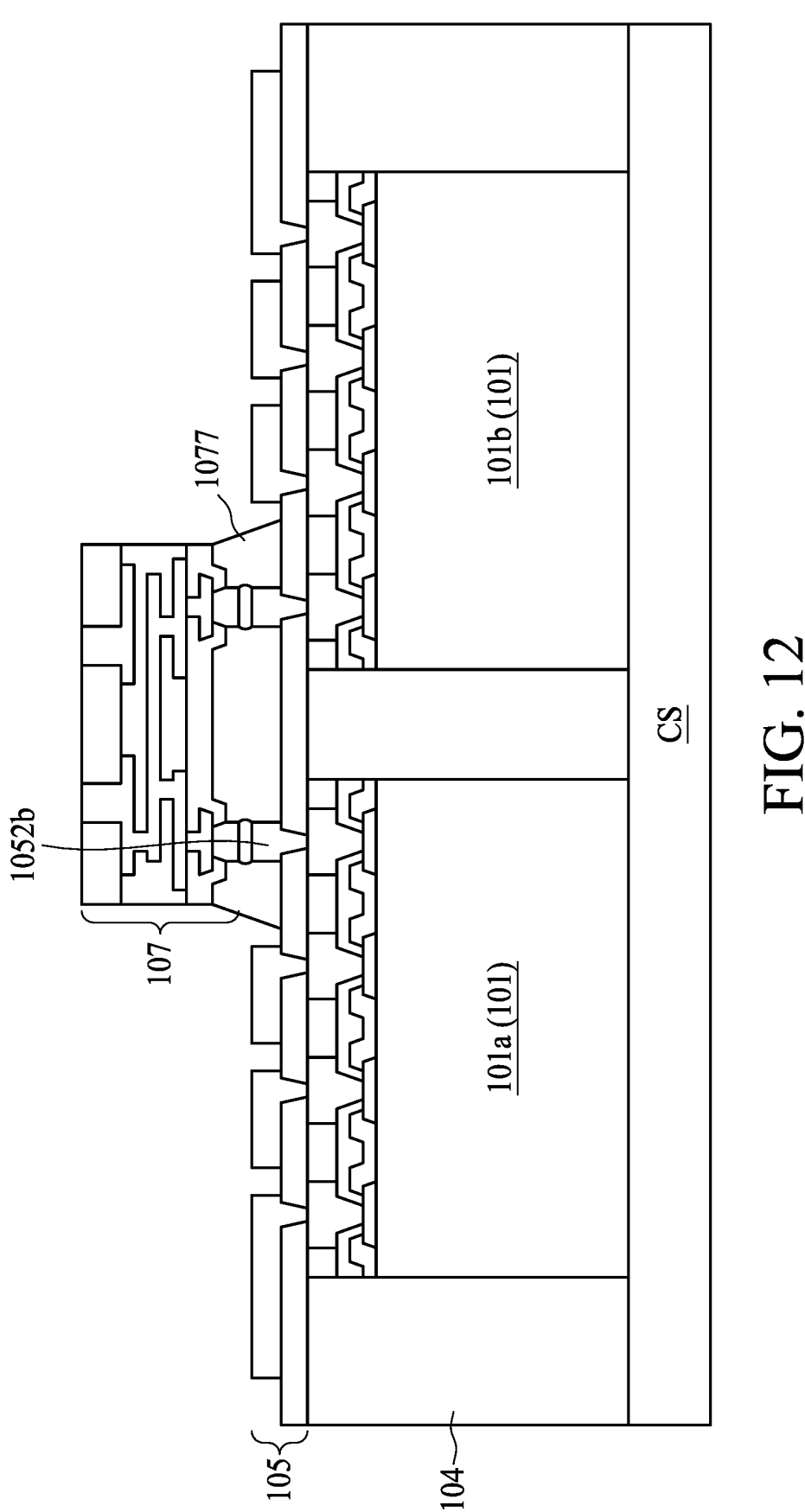

Referring to FIG. 12, in accordance with some embodiments, the method M10 further includes forming an underfill 1077 between the interposer 107 and the first RDL 105 and surrounding the micro-bump of the interposer 107 and the corresponding conductive pattern (i.e., pad portions 1052b) of the first RDL 105. The underfill 1077 covers the pad portions 1052b connected to the interposer 107, while the pad portions 1052b to be connected to the through-vias 109 are not covered by the underfill 1077 and thus exposed through the underfill 1077.

Figure 13:
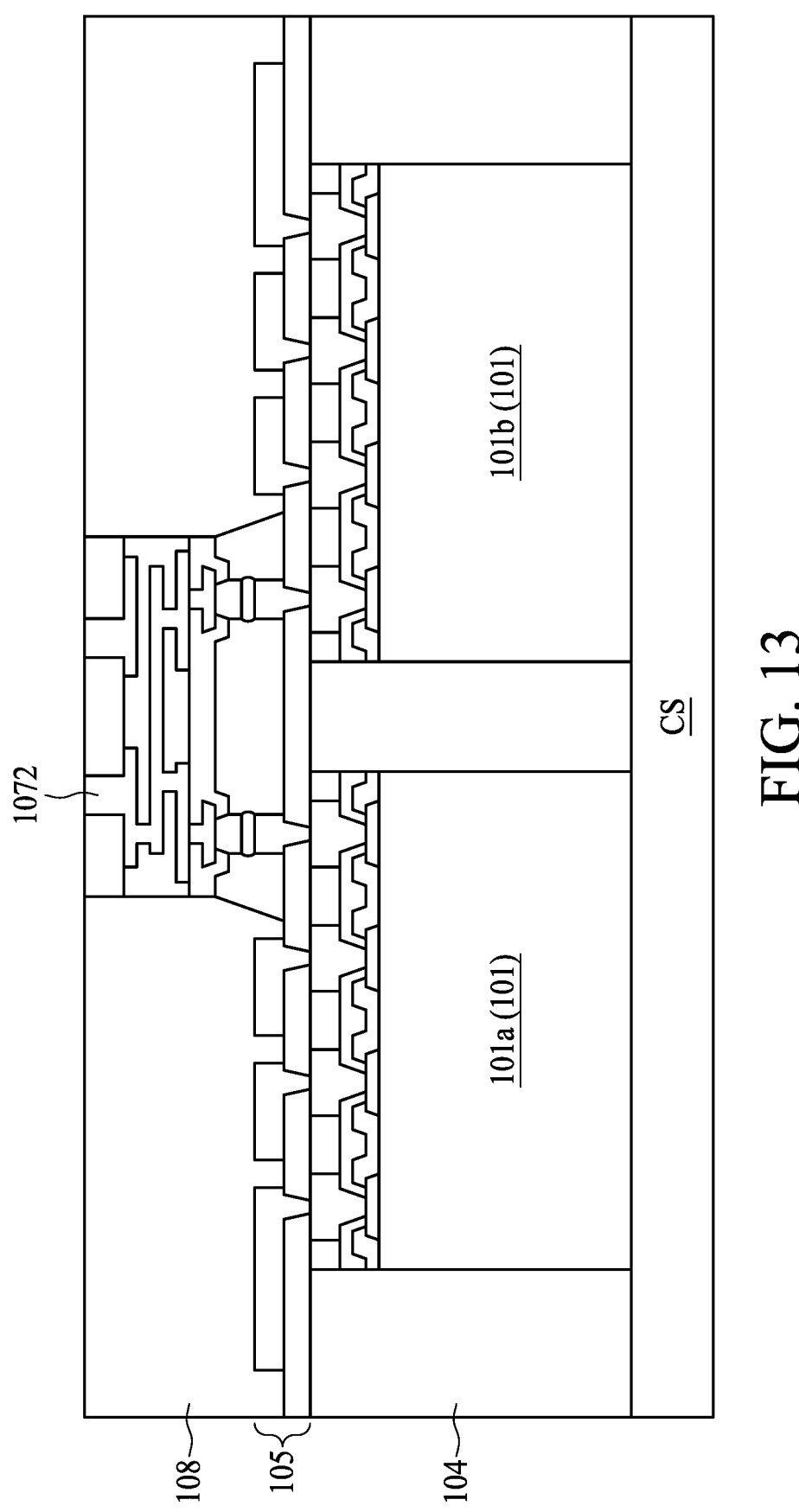

FIG. 13 is cross-sectional diagram illustrating the operation O15 of the method M10 in accordance with some embodiments of the present disclosure. A second molding 108 is formed to surround the interposer 107 and the underfill 1077. In some embodiments, the second molding 108 is disposed over the first RDL 105. In some embodiments, the second molding 108 is formed by disposing a molding material over the first RDL 105 and encapsulating the interposer 107 and the underfill 1077. In some embodiments, a portion of the molding material is removed to expose the vias 1072 of the interposer 107 to form the second molding 108. In some embodiments, a CMP is performed to remove a portion of the molding material covering the interposer 107. In some embodiments, a top surface of the interposer 107 is substantially coplanar with a top surface of the second molding 108.

Figure 14:
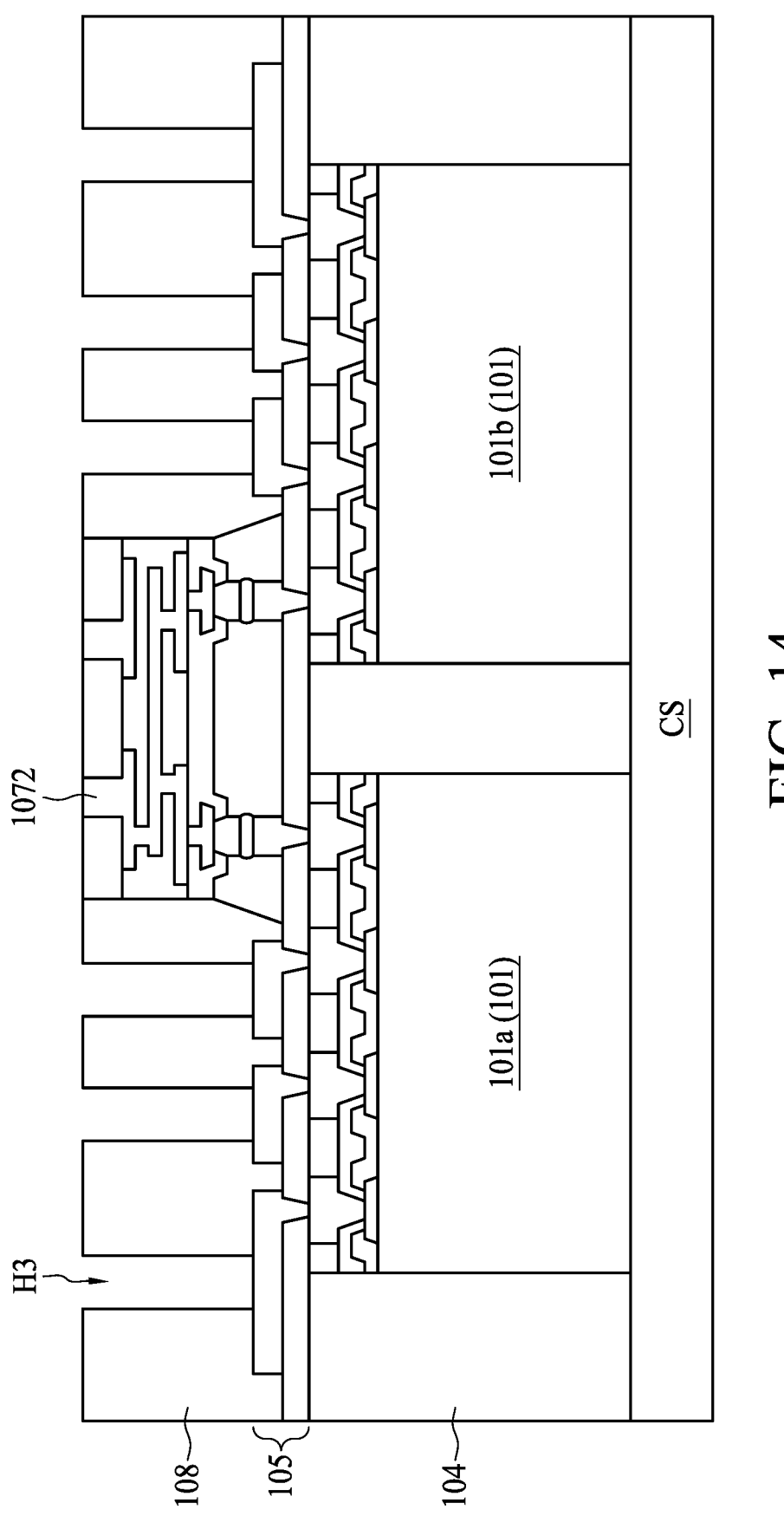
Figure 15:
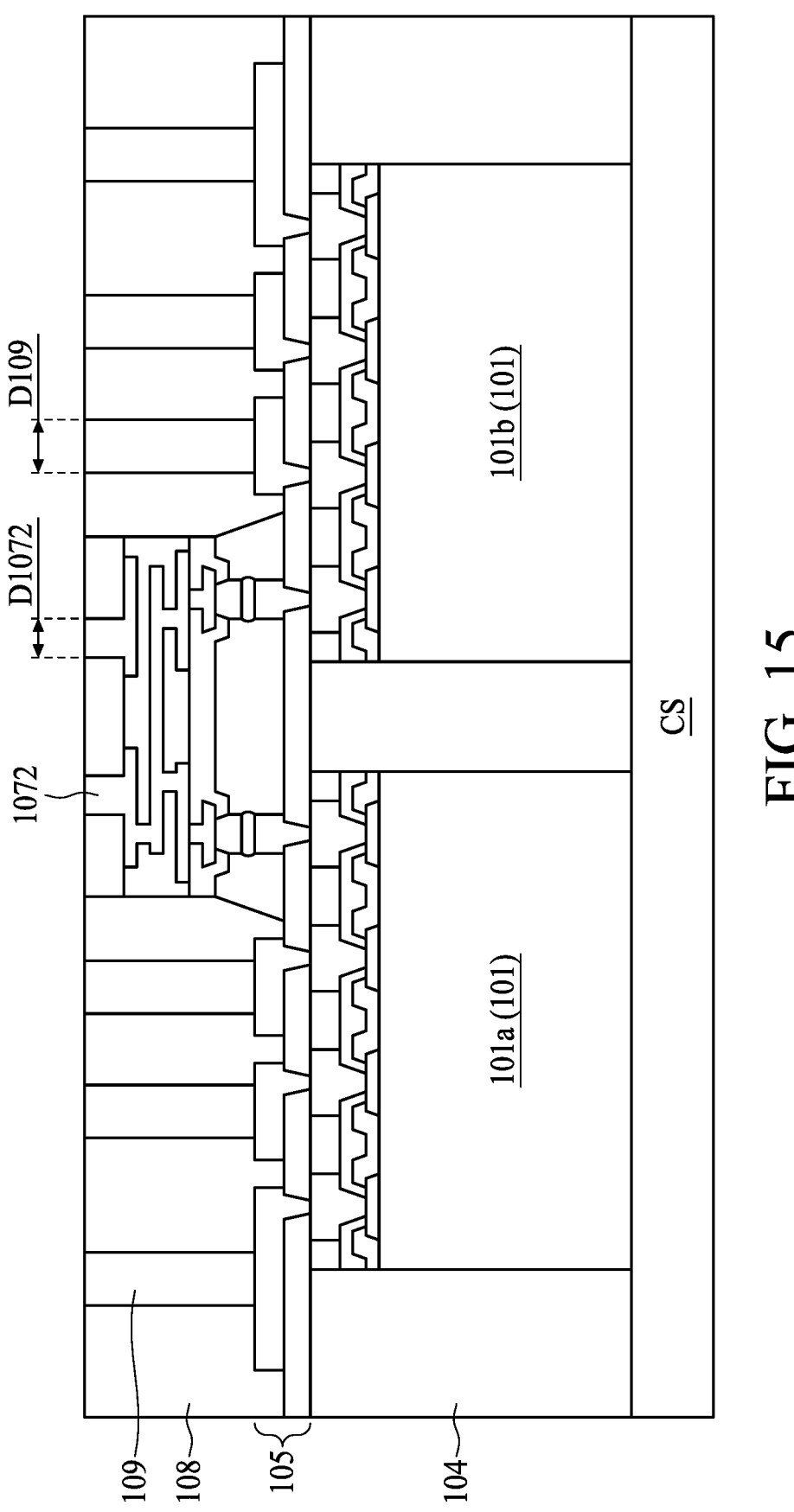

FIGS. 14 to 15 are cross-sectional diagrams illustrating the operation O16 of the method M10 in accordance with some embodiments of the present disclosure. One or more through-vias 109 are formed extending through and within the second molding 108. In some embodiments as shown in FIG. 14, portions of the second molding 108 are removed to form a plurality of openings H3 to at least partially expose pad portions 1052b that are not disposed under the interposer 107 or not covered by the underfill 1077.

In some embodiments as shown in FIG. 15, a conductive material is disposed within the opening H3 to form a plurality of through-vias 109 extending through and within the second molding 108. In some embodiments, the through-vias 109 are referred to as through-molding through-vias 109. In some embodiments, the through-vias 109 are formed by electroplating or any other suitable operations. In some embodiments, the conductive material fills the openings H3. In some embodiments, the conductive material overflows from the openings H3 and thus disposed over the top surface of the second molding 108. In some embodiments, a planarization operation is performed to remove the overflown portion of the conductive material to form the through-vias 109. In some embodiments, the planarization operation includes CMP or any other suitable operations.

In some embodiments, the through-vias 109 are adjacent to the interposer 107 and separated from the interposer 107 by the second molding 108. In some embodiments, a top surface of the through-via 109 is substantially coplanar with the top surface of the via 1072. In some embodiments, a width D109 of the through-via 109 is greater than the width D1072 of the via 1072. In some embodiments, the width D109 of the through-via 109 is at least twice as large as the width D1072 of the via 1072. In some embodiments, the width D109 of the through-via 109 is approximately 10 times as large as the width D1072 of the via 1072. In some embodiments, the width D109 of the through-via 109 is in a range of about 100 microns to about 300 microns.

Figure 16:
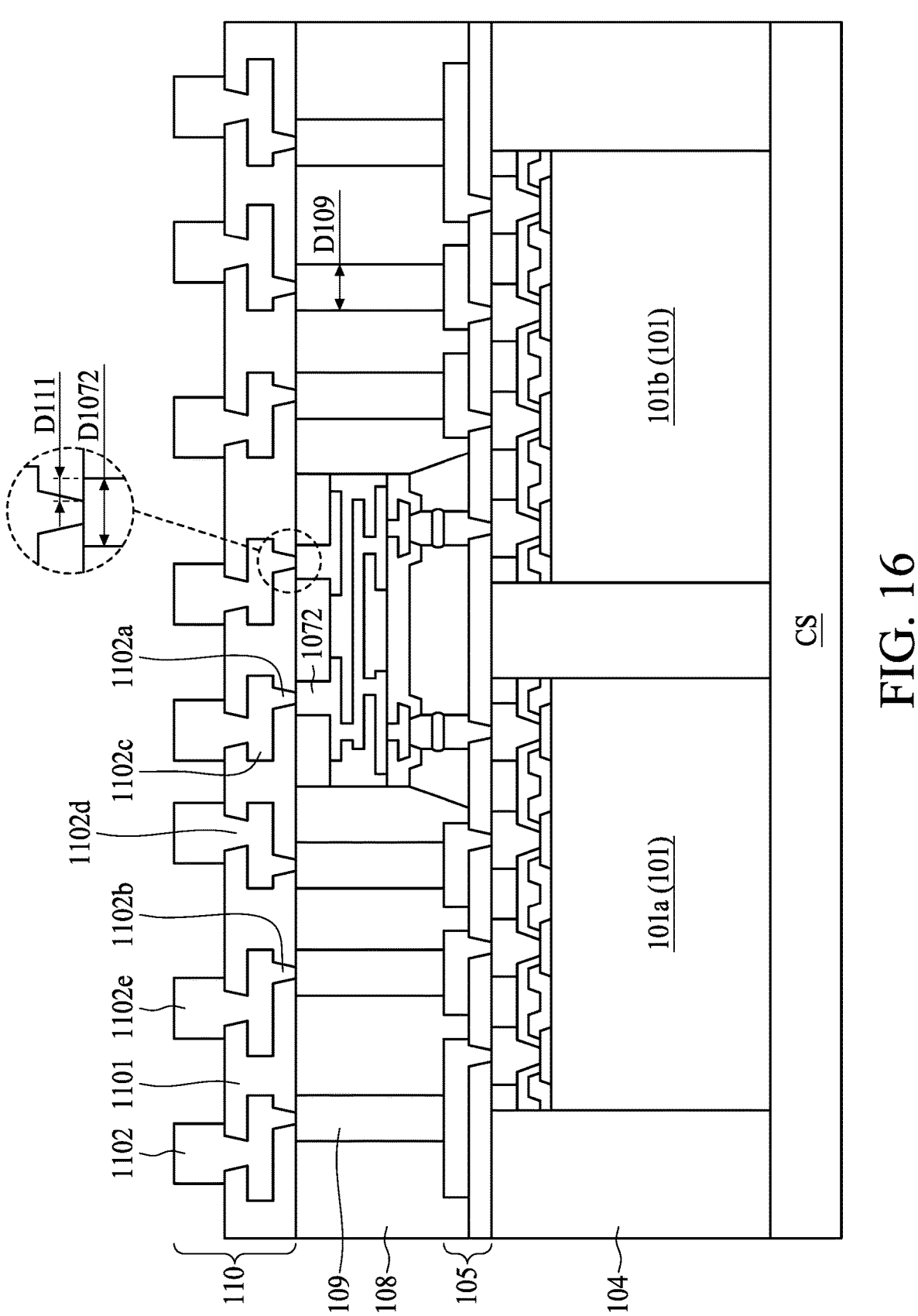

FIG. 16 is cross-sectional diagram illustrating the operation O17 of the method M10 in accordance with some embodiments of the present disclosure. A second RDL 110 is formed over the interposer 107 and the second molding 108. In some embodiments, the second RDL 110 is adjacent to the silicon layer 1073 of the interposer 107. In some embodiments, the second RDL 110 is electrically connected to the vias 1072 of the interposer 107.

In some embodiments, the second RDL 110 includes a second dielectric layer 1101 and a second interconnect structure 1102. In some embodiments, the second dielectric layer 1101 is disposed over the interposer 107 and the second molding 108. In some embodiments, the second interconnect structure 1102 is surrounded by the second dielectric layer 1101 and electrically connected to the through-vias 109 and the interposer 107. In some embodiments, the second interconnect structure 1102 contacts the through-vias 109 and the vias 1072 of the interposer 107.

In some embodiments, the second RDL 110 is a multi-layer structure, similar to the structure of the first RDL 105. In some embodiments, the second dielectric layer 1101 includes a plurality of layers of dielectric materials stacked in sequence over the second molding 108 and the interposer 107. In some embodiments, the second interconnect structure 1102 includes a plurality of conductive patterns distributed in and surrounded by the plurality of layers of dielectric materials. In some embodiments, the plurality of conductive patterns includes via portions and pad portions.

In some embodiments, formation of the second RDL 110 is similar to the formation of the first RDL 105, and repeat description is omitted herein for a purpose of brevity. In some embodiments, the second interconnect structure 1102 includes a plurality of via portions 1102a electrically connected to the vias 1072 of the interposer 107. In some embodiments, the via portions 1102a are in contact with the vias 1072 of the interposer 107. In some embodiments, the second interconnect structure 1102 further includes a plurality of via portions 1102b electrically connected to the through-vias 109 and disposed at the same elevation as the via portions 1102a.

In some embodiments, the second interconnect structure 1102 further includes a plurality of pad portions 1102c disposed over and electrically connected to the via portions 1102a and the via portions 1102b. In some embodiments, the second interconnect structure 1102 further includes a plurality of via portions 1102d disposed over and electrically connected to the pad portions 1102c. In some embodiments, the second interconnect structure 1102 further includes a plurality of pad portions 1102e disposed over and electrically connected to the via portions 1102d. In some embodiments, the pad portion 1102e is an under bump metallurgy (UBM) pad. In some embodiments, the pad portion 1102e is formed by deposition, evaporation or any other suitable operations.

In some embodiments, a width of the via portion 1102a is less than a width of the via portion 1102b, wherein the widths of the via portion 1102a and the via portion 1102a are measured along the same direction, e.g. an extending direction of the arrangement of the via portion 1102a and the via portion 1102b. In some embodiments, the via portion 1102a is referred to as a micro-via portion 1102a due to smaller diameters (widths) of the via portions 1102a as compared to diameters (widths) of the via portions 1102b. In some embodiments, in order to ensure electrical connection between the interposer 107 and the second RDL 110, a center of the via portion 1102a is designed to align with a center of the corresponding via 1072 of the interposer 107.

In some embodiments, the via portion 1102a overlaps and contacts the via 1072 of the interposer 107. In some embodiments, a bottom width of the via portion 1102a (where interfacing the via 1072) is less than the width D1072 of the via 1072 by an amount approximately equal to twice a distance D111, wherein the distance D111 is measured from a boundary of an interface between the via portion 1102a and the via 1072 to a boundary of a top surface of the via 1072 when the centers of the via portion 1102a and the via 1072 are aligned. In some embodiments, the distance D111 is in a range of about 1 micron to about 5 microns. In some embodiments, the via portion 1102a has a tapered configuration with a narrower bottom and a wider top from a cross-sectional perspective. In some embodiments, the via portion 1102b overlaps and contacts the through-via 109. In some embodiments, a bottom width of the via portion 1102b is less than the width D109 of the through-via 109. In some embodiments, the via portion 102b has a tapered configuration with a narrower bottom and a wider top from a cross-sectional perspective.

In some embodiments, a second RDL design file of the second RDL 110 with a fourth format is received before formation of the second RDL 110. In some embodiments, the second RDL design file includes RLC data, and an RC extraction is performed to generate an updated second RDL design file including RC data. In some embodiments, the fourth format of the second RDL design file is incompatible with the first format of the die design file and the third format of the interposer design file. In some embodiments, the updated second RDL design file is input into a package design software to generate a new file including the locations and layout of the vias 1072 including shape data of the vias 1072. Therefore, the first RDL 105 can be designed to electrically connect to the dies 101 accordingly. DRC can be also performed on the second RDL 110, the interposer 107, the integrated first RDL 105 and the dies 101 to ensure the layout of a package structure conforms to the design rules.

Figure 17:
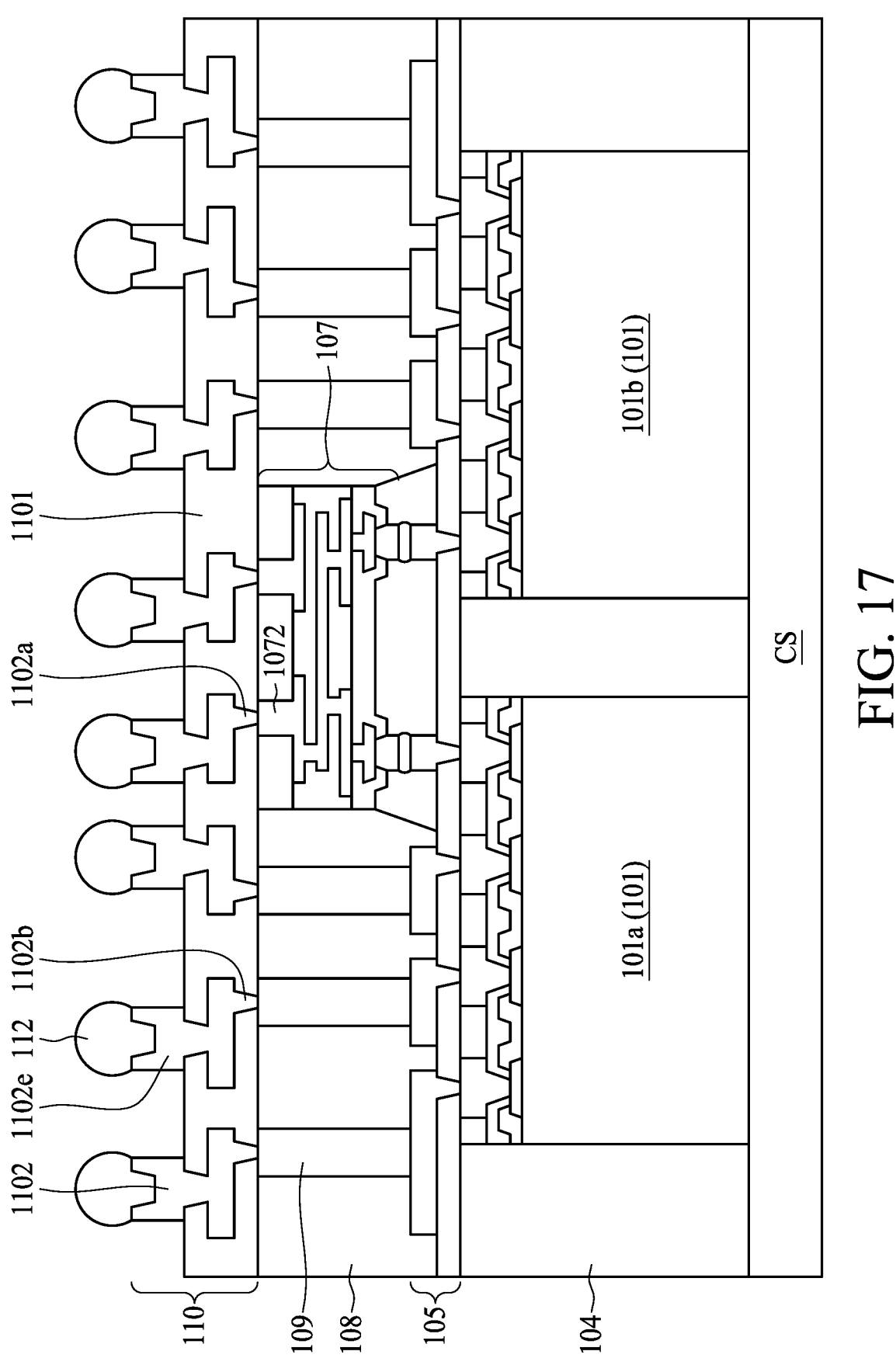

Referring to FIG. 17, in accordance with some embodiments, the method M10 further includes forming a plurality of solder bumps 112 over the pad portions 1102e of the second interconnect structure 1102 of the second RDL 110. In some embodiments, the interposer 107 and the second interconnect structure 1102 are electrically connected to the solder bumps 112 disposed over the second RDL 110. In some embodiments, the dies 101 are electrically connected to the second RDL 110 through the through-vias 109, thereby electrically connecting the dies 101 to other electrical elements through the solder bumps 112. In some embodiments, the dies 101 are electrically connected to the second RDL 110 respectively through the interposer 107, thereby electrically connecting the dies 101 to other electrical elements through the solder bumps 112. In some embodiments, the solder bumps 112 are formed by ball dropping, electroplating or any other suitable operations.

Figure 18:
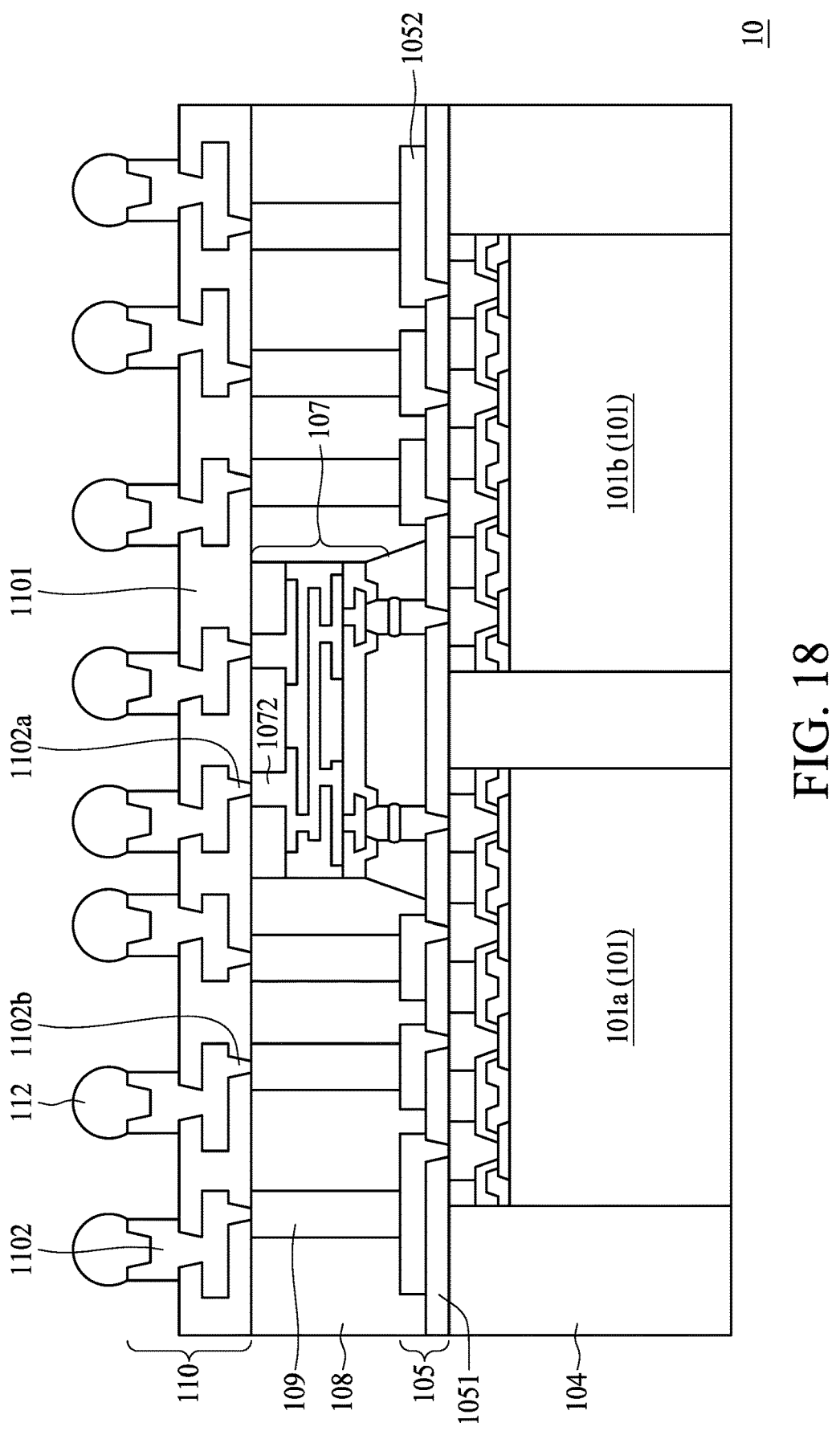

Referring to FIG. 18, the method M10 further includes detaching the carrier substrate CS from the dies 101 and the first molding 104 to form a package structure 10. In some embodiments, since a diameter (i.e., the width D109) of the through-via 109 is much greater than a diameter of electrical wiring (e.g., the vias 1072, the interconnect structure 1075, and the conductive pillars 1071) of the interposer 107, the through-via 109 is electrically connected to a power supply and configured to deliver power to the dies 101. In some embodiments, the via 1072 is electrically connected to an input/output terminal and configured to transmit digital signals.

Figure 19:
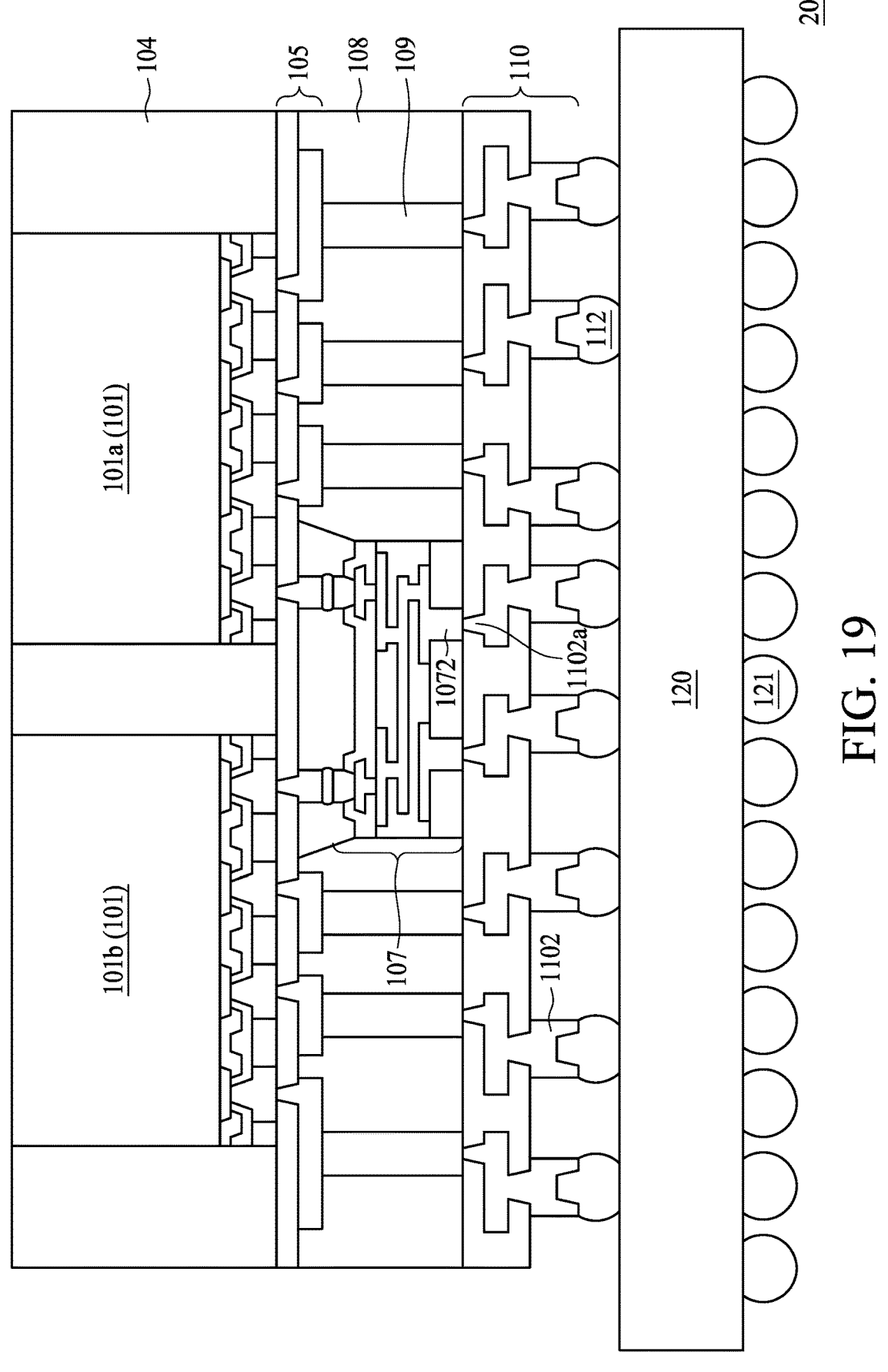
FIG. 19 is a cross-sectional view of a package structure in accordance with some embodiments of the present disclosure.

The method M10 further includes bonding a semiconductor substrate 120 over the second RDL 110 and the solder bumps 112 to form a package structure 20. In some embodiments, the intermediate structure as shown in FIG. 18 is flipped over and electrically connected to the semiconductor substrate 120 through the solder bumps 112 to form the package structure 20 as shown in FIG. 19. In some embodiments, the semiconductor substrate 120 includes a plurality of solder balls 121 disposed on a side of the semiconductor substrate 120 opposite to the solder bumps 112. In some embodiments, the operation of detaching the carrier substrate CS from the dies 101 and the first molding 104 can be performed prior to or after the attachment of the semiconductor substrate 120. Therefore, the completed package structure 20 is provided, including the semiconductor substrate 120, the second RDL 110, the interposer 107, the first RDL 105 and the dies 101 stacked in sequence, wherein the interposer 107 and the through-vias 109 are at the same elevation and separated by the second molding 108, wherein the second molding 108 is disposed between the second RDL 110 and the first RDL 105.

As illustrated above, fabrications of package structures (e.g., the package structures 10 and 20) of the present disclosure include complex manufacturing processes. Fabrication of different elements of the package structure 10 may be achieved by different departments of a company, different technical teams, or electrical suppliers. For instance, the dies 101 and the interposer 107 can be manufactured individually and then integrated with the RDLs 110 and 105 and the moldings 104 and 108. Because different technologies, different design languages, and/or different design formats are applied during different stages of manufacturing process for forming different electrical elements, it is difficult to perform comprehensive design rule check (DRC), resistance-capacitance check (RC check), resistance-inductance-and-capacitance check (RLC check), and/ or static timing analysis (STA) on an integrated package structure. The present disclosure provides a methodology to integrate design files and design data of different elements, allowing comprehensive testing and analysis to be performed.

In some embodiments, a plurality of electrical paths are tested based on the integrated design files and design data of different elements. In some embodiments, DRC, RC check, RLC check and/or STA are performed to ensure electrical connection of a die-to-die electrical path through the interposer 107. In some embodiments, DRC, RC check, RLC check and/or STA are performed to ensure electrical connection from the second RDL 110 to the die 101 through the through-vias 109, or from the die 101 to the second RDL 110 through the through-vias 109. In some embodiments, DRC, RC check, RLC check and/or STA are performed to ensure electrical connection from the second RDL 110 to the die 101 through the interposer 107, or from the die 101 to the second RDL 110 through the interposer 107.

Some embodiments of the present disclosure provide a package structure. The package structure includes a die, a first molding, a first redistribution layer (RDL), an interposer, a second molding, a first via, and a second RDL. The first molding surrounds the die. The first RDL includes a first dielectric layer disposed over the die and the first molding, and a first interconnect structure surrounded by the first dielectric layer and electrically connected to the die. The interposer is disposed over the first RDL and electrically connected to the die through the first interconnect structure. The second molding surrounds the interposer. The first via extends through and within the second molding and is adjacent to the interposer. The second RDL includes a second dielectric layer disposed over the interposer and the second molding, and includes a second interconnect structure surrounded by the second dielectric layer and electrically connected to the via and the interposer.

Some embodiments of the present disclosure provide a package structure. The package structure includes a semiconductor substrate, an interposer, a first die, a second die, a first molding, a second molding and a via. The interposer is disposed over the semiconductor substrate and electrically connected to the semiconductor substrate through a first redistribution layer (RDL). The first die is disposed over the semiconductor substrate and electrically connected to the interposer through a second RDL. The second die is adjacent to the first die and electrically connected to the first die through the interposer. The first molding surrounds the interposer and is disposed between the first RDL and the second RDL. The second molding separates the first die and the second die over the semiconductor substrate. The via penetrates the first molding and electrically connects the first RDL to the second RDL.

Some embodiments provide a method for forming a package structure. The method includes several operations. A die is firstly received. A first molding is formed surrounding the die. A first redistribution layer (RDL) is formed and includes a first dielectric layer and a first interconnect structure, wherein the first dielectric layer is disposed over the die and the first molding, and the first interconnect structure is surrounded by the first dielectric layer and electrically connected to the die. An interposer is disposed over the first RDL to electrically connect the interposer to the die through the first interconnect structure. A second molding is formed and surrounds the interposer. A first via is formed and extends through and within the second molding. A second RDL is formed over the interposer and the second molding, wherein the second RDL includes a second dielectric layer disposed over the interposer and the second molding, and a second interconnect structure surrounded by the second dielectric layer and electrically connected to the first via and the interposer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
receiving a die;
forming a first molding surrounding the die;
forming a first redistribution layer (RDL) including a first dielectric layer and a first interconnect structure, wherein the first dielectric layer is disposed over the die and the first molding, the first interconnect structure has a via portion surrounded by the first dielectric layer and electrically connected to the die, and a pad portion disposed over the first dielectric layer and coupled with the via portion;
disposing an interposer over the first RDL to electrically connect the interposer to the die through the first interconnect structure;
disposing an underfill between the interposer and the first dielectric layer;
disposing a molding material over the interposer and the first RDL to cover the interposer and the first RDL;

removing a portion of the molding material to expose a back side of the interposer and form a second molding surrounding the interposer and the underfill;
after the formation of the second molding, removing a portion of the second molding to form an opening to expose a portion of the first interconnect structure, wherein the back side of the interposer and at least the portion of the first interconnect structure are exposed through the second molding prior to the removal of the portion of the second molding, and the removal of the portion of the molding material is prior to the removal of the portion of the second molding;
after the formation of the opening, forming a first via within the opening and extending through the second molding; and
forming a second RDL over the interposer and the second molding,
wherein the second RDL includes a second dielectric layer and a second interconnect structure, the second dielectric layer is disposed over the interposer and the second molding, and the second interconnect structure is surrounded by the second dielectric layer and electrically connected to the first via and the interposer, and a height of the opening is substantially less than a height of the second molding.

2. The method of claim 1, wherein the formation of the first molding comprises:
attaching the die over a carrier substrate;
disposing a molding material encapsulating the die over the carrier substrate; and
removing a portion of the molding material to expose a contact of the die.

3. The method of claim 1, wherein the formation of the first RDL comprises:
disposing a dielectric material over the die and the first molding;
removing a portion of the dielectric material to form a first opening over the contact of the die; and
disposing a conductive material within the first opening to form the via portion of the first interconnect structure.

4. The method of claim 3, further comprising:
disposing a photoresist over the dielectric material;
patterning the photoresist to form a second opening;
disposing a conductive material within the second opening to form the pad portion of the first interconnect structure; and
removing the photoresist, wherein the contact of the die is in contact with the via portion.

5. The method of claim 4, wherein the first via is in contact with the pad portion of the first RDL.

6. The method of claim 4, wherein the disposing of the interposer includes bonding a conductive pillar of the interposer with the pad portion of the first RDL.

7. The method of claim 6, wherein the underfill is disposed to surround the pad portion of the first RDL and the conductive pillar of the interposer.

8. The method of claim 7, wherein the underfill is disposed after the disposing of the interposer and before the formation of the second molding.

9. The method of claim 1, further comprising:
forming a plurality of solder members between the first RDL and the interposer.

10. The method of claim 1, wherein a top surface and a side surface of the pad portion contact the second molding.

11. A method for forming a package structure, comprising:

receiving a first die and a second die;

forming a first molding surrounding the first die and the second die;

forming a first redistribution layer (RDL) including a first dielectric layer and a first interconnect structure, wherein the first dielectric layer is disposed over the first die, the second die and the first molding, the first interconnect structure is surrounded by the first dielectric layer and electrically connected to the first die and the second die;

disposing an interposer over the first RDL to electrically connect the interposer to the first die and the second die through the first interconnect structure;

disposing an underfill between the interposer and the first die and between the interposer and the second die;

disposing a molding material over the interposer and the first RDL to cover the interposer and the first RDL;

removing a portion of the molding material to expose a back side of the interposer and form a second molding surrounding the interposer;

after the formation of the second molding, removing a portion of the second molding to form an opening to expose the first interconnect structure; and after the formation of the opening, forming a first via within the opening and extending through the second molding, wherein the first via is electrically connected to the interposer via the first die or the second die, the back side of the interposer and at least a portion of the first interconnect structure are exposed through the second molding prior to the formation of the first via, the removal of the portion of the molding material is prior to the removal of the portion of the second molding, and a height of the first via is substantially less than a height of the second molding.

12. The method of claim 11, wherein a portion of the first molding is disposed between the first die and the second die.

13. The method of claim 12, wherein the interposer is disposed over the portion of the first molding.

14. The method of claim 11, further comprising forming a second RDL over the interposer and the second molding.

15. The method of claim 14, wherein the second RDL includes a second dielectric layer and a second interconnect structure, the second dielectric layer is disposed over the interposer and the second molding, and the second interconnect structure is surrounded by the second dielectric layer and electrically connected to the first via and the interposer.

16. A method for forming a package structure, comprising:

receiving a die;

forming a first redistribution layer (RDL) including a first dielectric layer and a first interconnect structure, wherein the first dielectric layer is disposed over the die, and the first interconnect structure is surrounded by the first dielectric layer and electrically connected to the die;

forming a second RDL including a second dielectric layer and a second interconnect structure, wherein the second dielectric layer is disposed over the first RDL, the second interconnect structure has a first portion surrounded by the second dielectric layer and electrically connected to the first interconnect structure of the first RDL, and a second portion disposed over the second dielectric layer and coupled with the first portion;

disposing an interposer over the second RDL;

disposing an underfill between the interposer and the second dielectric layer;

forming a molding over the second RDL and entirely encapsulating the interposer and the underfill;

removing portions of the molding to expose a back side of the interposer and to form an opening to partially expose the second interconnect structure; and after the formation of the opening, forming a via within the opening and extending through the molding and coupled to the second interconnect structure, wherein the back side of the interposer and at least a portion of the second interconnect structure are exposed through the molding simultaneously after the formation of the opening and prior to the formation of the via, and a height of the first via is substantially less than a total height of the interposer and the underfill.

17. The method of claim 16, wherein the via is disposed adjacent to the interposer and electrically connected to the second interconnect structure.

18. The method of claim 17, wherein the via is disposed over the die.

19. The method of claim 16, wherein the underfill contacts the second dielectric layer.

20. The method of claim 16, further comprising forming a third RDL over the interposer and the molding, wherein the third RDL includes a third dielectric layer and a third interconnect structure, the third dielectric layer is disposed over the interposer, and the third interconnect structure is electrically connected to the second interconnect structure via the interposer, and the interposer is in contact with the third dielectric layer.

\* \* \* \* \*